(12) United States Patent
Tortonese et al.

(10) Patent No.: US 6,821,812 B1
(45) Date of Patent: Nov. 23, 2004

(54) STRUCTURE AND METHOD FOR MOUNTING A SMALL SAMPLE IN AN OPENING IN A LARGER SUBSTRATE

(75) Inventors: Marco Tortonese, Mountain View, CA (US); Dimitar Ovtcharov, Palo Alto, CA (US); René Maurice Blanquies, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 10/318,487

(22) Filed: Dec. 13, 2002

(51) Int. Cl.[7] .............................................. H01L 21/44
(52) U.S. Cl. ..................... 438/106; 438/125; 438/719; 257/678; 257/686; 257/702; 257/704; 257/730
(58) Field of Search ................................ 438/106, 125, 438/719; 257/678, 686, 702, 704, 730, 719

(56) References Cited

U.S. PATENT DOCUMENTS

| | | | | |
|---|---|---|---|---|
| 5,563,444 A | * | 10/1996 | Leroux et al. | 257/679 |
| 6,413,153 B1 | * | 7/2002 | Molnar | 451/259 |
| 6,461,934 B2 | * | 10/2002 | Nishida et al. | 438/424 |

* cited by examiner

*Primary Examiner*—Eddie Lee
*Assistant Examiner*—Thomas Magee
(74) *Attorney, Agent, or Firm*—John P. Taylor

(57) ABSTRACT

A process and structure for mounting a small sample in an opening in a larger substrate by using an intermediate size structure, wherein the small sample is mounted in a small opening in the intermediate size structure which then, in turn, is mounted in an intermediate size opening in the large substrate. As a result, the formation of gaps around the edge of the sample may be voided. The process is carried out by first mounting the test sample in a opening formed with tapered sidewalls through a die with the upper surface of the sample directly abutting the edges of the smallest portion of the tapered opening in the die, The die is then mounted in an opening with tapered sidewalls in a test wafer. The opening in the die is sized to equal, at the smallest end of the tapered sidewalls of the opening, the width and length of the square sample. By placing down on a common flat surface abutting one another, both the surface of interest of the sample, and the surface of the die adjacent the smallest portion of the tapered sidewall opening, the die and the sample may be secured to one another by an adhesive introduced into the gap on the respective rear sides of the die and sample. Virtually no gap is visible between the surface of the sample and the surface of the die abutting one another when the sample and the die are joined in this manner. The secured-together die and sample are then inverted and placed in a larger opening in the test wafer and then bonded to the wafer. When a gap is thus formed between the wafer and the die, this is usually far enough from the sample so as to not be within the field of view of equipment focused on the sample.

18 Claims, 4 Drawing Sheets

STRUCTURE AND METHOD FOR MOUNTING A SMALL SAMPLE IN AN OPENING IN A LARGER SUBSTRATE

BACKGROUND OF THE INVENTION

1. Field of the Invention

In its broadest sense, this invention relates to a structure and method for mounting a small sample in an opening in a larger substrate. In a specific embodiment, this invention relates to a structure and method for mounting a small sample of an integrated circuit structure in an opening in a larger substrate such as a semiconductor wafer.

2. Description of the Related Art

Each generation of integrated circuit structures comprises ever smaller structures which must be inspected, tested, and measured using next generation inspection and metrology equipment which must be developed concurrently with the development of the integrated circuit structures. To develop such inspection and metrology equipment, it is necessary that such equipment be tested and calibrated using test wafers processed with such next generation technologies. However, such next generation process technologies typically do not yield samples in wafer form, due to the expense of producing such large size samples.

However, it is often possible to use such next generation technologies to produce small samples in small volume on an experimental basis. But for these samples to be used in an automated metrology or inspection tool, they need to be mounted on a test wafer, typically about 200 millimeters (mm) to about 300 mm in diameter compared to, for example, a 1–10 mm by 1–10 mm generallyrectangular sample. Such small samples need to be mounted in and on such relatively large wafers in such a waythat they appear to the inspection or metrology tools as though they had been formed directly onto and into the wafer. Mounting requirements are that the small sample be coplanar with the upper surface of the wafer, that the backside and edges of the wafer be intact to preserve the ability to load the wafer using a robotic handler, and that the gap between the sample and the rest of the wafer be as small as possible. This is particularly important for CD-SEM tools, where inappropriate mounting can produce fringe fields that distort the imaging.

In the past, the way a small sample containing new processing technology was mounted in a larger test wafer was to isotropically etch a pocket into a <100> silicon wafer to a depth "t" slightly greater than the thickness or depth of the sample to be mounted. This is shown in prior art FIGS. 1 and 2 where a semiconductor test wafer 2 is shown formed with an etched opening or pocket 10 therein, having a depth t. and a sample 16 shown secured in opening 10 by an adhesive material 20.

The problem with this structure and method was that a gap 24 was formed between wafer 2 and sample 16 due to the taper of the sidewalls of opening 10. The tapered sidewalls of opening 10 were formed due to the anisotropic etch characteristics of the etchant used to form opening 10 in test wafer 2. Experimentally, it was found that the gap formed between the tapered sidewall of opening 10 and sample 16 by the taper in the sidewalls of sample 16 is about 0.71 t, where t is the depth of opening 10. This can result in formation of gaps which may be hundreds of micrometers ($\mu$m) wide. For example, when opening 10 is 0.5 mm deep, the gap between sample 16 and the tapered sidewall of opening 10 may be as much as 355 $\mu$m wide, as shown in prior art FIGS. 1 and 2. Such a large gap can be seen by the inspection and metrology equipment and has been found to interfere with the testing and calibration of the equipment being developed for the new processing technology.

While it might appear to be simple to merely alter the means used to form the opening, such alterations are also fraught with problems. For example, if a laser were to be used instead of the etchant system to achieve non-tapered walls in opening 10, loss of depth control of opening 10 in wafer 2 could occur resulting in opening 10 extending completely through wafer 2. Furthermore, etching a silicon wafer having a <110> upper surface (instead of the <100> upper surface referred to above) would achieve formation of the desirable non-tapered walls in an opening 10, but that face of silicon cannot be etched to yield a rectangular shaped opening (as viewed from the top of opening 10). Rather an opening having the cross-section of a parallelogram is formed. Furthermore, even if an opening having non-tapered sidewalls and rectangular in cross-section could be formed, it would be difficult to mount the sample in such an opening (if an adhesive was used), without forming an undesirable gap between the sample and such non-tapered sidewalls.

It would, therefore, be desirable to provide a way of mounting a sample in/on a substrate such as a semiconductor test wafer in a manner which will suppress or avoid formation of gaps adjacent the edge of the sample, which gap, for example, would be visible to inspection and metrology equipment being tested and calibrated.

SUMMARY OF THE INVENTION

The invention, in its broadest sense, comprises a process and structure for mounting a small sample in an opening in a large substrate by using an intermediate size structure. wherein the small sample is mounted in a small opening in the intermediate size structure which then, in turn, is mounted in an intermediate size opening in the large substrate.

In a preferred embodiment the invention comprises a process and structure for mounting a small sample containing integrated circuit structure, such as next generation technology, in an opening in a larger test substrate, such as a semiconductor wafer, without the formation of gaps around the edge of the sample which would be visible to equipment being tested and calibrated. This embodiment of the process is carried out by first mounting the test sample in an opening in a die. The opening in the die is formed completely through the die, and has tapered sidewalls.

The upper surface of the sample directly abuts the edges of the smallest portion of the tapered opening in the die, The die is then, in turn, mounted in a test wafer in an opening with tapered sidewalls in the test wafer. The opening in the die is sized to generally equal, at the smallest end of the tapered sidewalls of the opening, the width and length of the rectangular sample. By placing both the surface of the sample containing the new process technology and the surface of the die adjacent the smallest portion of the tapered sidewall opening down on a common flat surface, the die and the sample may be secured to one another by an adhesive introduced into the gap on the respective rear sides of the die and sample. When the secured together die and sample are then inverted and placed in a larger opening in the test wafer, the test equipment does not see any gap between the sample and the die (due to the butting together of the sample and die. The test equipment also does not see any gap between the die and the test wafer (despite the possible existence of a such a gap, depending on the means used to secure the die to the test wafer) because the overall dimensions of the die are preselected to exceed the boundaries of the field of view of the new technology equipment being tested and calibrated.

DETAILED DESCRIPTION OF THE INVENTION

Figure 1:
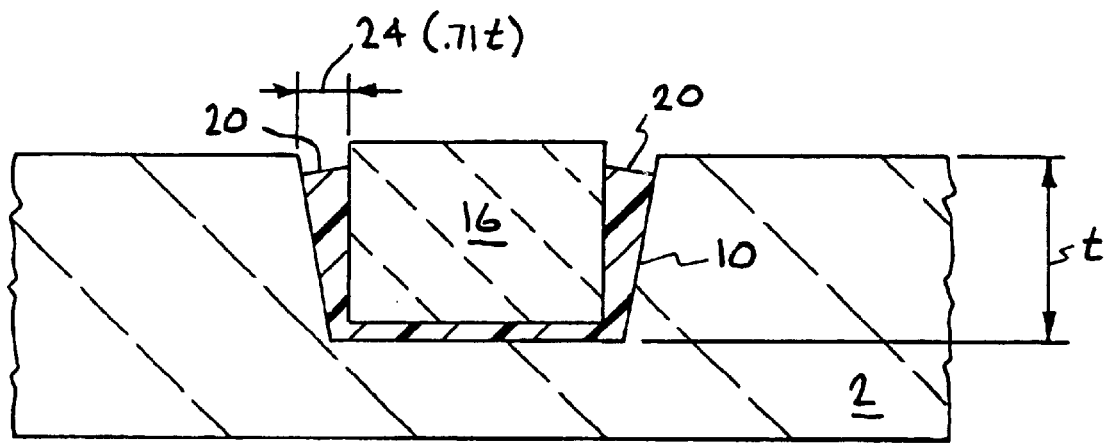
FIG. 1 is a fragmentary vertical side section view of a prior art sample mounted in an opening or pocket formed in a substrate such as a semiconductor wafer, showing the gap between the end edge of the sample and the sidewall of the opening adjacent the top surface of the substrate.
Figure 2:
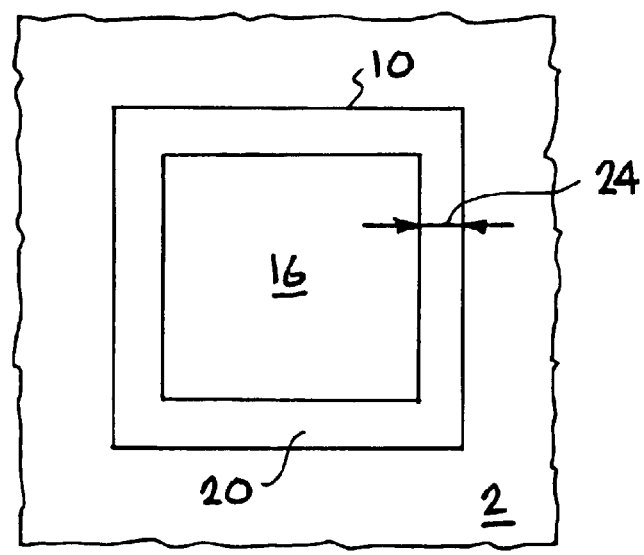
FIG. 2 is a top view of the prior art structure of FIG. 1, again showing the gap between the edge of the sample and the edge of the opening at the top surface of the substrate.

The invention, in its broadest sense, comprises a process and structure for mounting a small sample in an opening in a larger substrate by using an intermediate size structure. wherein the small sample is mounted in a small opening in the intermediate size structure. The small opening in the intermediate structure preferably is the same size as at least one dimension of the sample. The intermediate structure is then, in turn, mounted in an intermediate size opening in the large substrate.

In a preferred embodiment, the invention comprises a process and structure for mounting a small sample containing new processing technology in a larger test substrate, such as a semiconductor wafer, without the formation of gaps around the edge of the sample which would be visible to equipment being tested and calibrated. The invention, however, also will be found useful in the studying of the effect of various etchants on various materials. The invention could also be used to cut out, or in other ways remove, defects in a wafer and then to patch the wafer. The invention will be described in depth below, however, with respect to the preferred embodiment, i.e., for use with respect to the development, testing, and calibration of equipment for use in new technology by way of illustration, and not by way of limitation, The process and structure in the preferred embodiment, is carried out by first mounting a rectangular test sample, containing new technologies, in a rectangular opening with tapered sidewalls, formed completely through a die, with the upper surface of the sample directly abutting the edges of the smallest portion of the tapered opening in the die, The die is then mounted in an opening in a test wafer. The opening in the die is sized to equal, at the smallest end of the tapered sidewalls of the opening, the width and length of the rectangular sample. By placing both the surface of the sample containing the new process technology and the surface of the die adjacent the smallest portion of the tapered sidewall opening down on a common flat surface, the die and the sample may be secured to one another by an adhesive introduced into the gap on the respective rear sides of the die and sample. When the secured-together die and sample are then inverted and placed in a larger opening in the test wafer, the test equipment does not see any gap between the sample and the die (due to the butting together of the sample and die). The test equipment also does not see any gap between the die and the test wafer (despite the possible existence of a such a gap, depending on the means used to secure the die to the test wafer) because the overall dimensions of the die are preselected to exceed the boundaries of the field of view of the new technology equipment being tested and calibrated.

The terms: "small", "intermediate", and "large", when used to describe the respective sizes of the "small sample", the "intermediate structure" or "intermediate die", and the "large substrate" or "large wafer", are intended to describe relative sizes with respect to one another, and will, therefore vary in absolute values. However, the large substrate or wafer will always be at least twice as large in area as the small sample. in at least one dimension; and the intermediate structure or die will always be at least 10% larger in area than the small sample in at least one dimension and will always be at least 10% smaller in area than the large substrate or wafer in at least one dimension.

The Sample

The sample comprises a rectangular base or substrate (usually square) on which may be formed various integrated circuit structure such as, for example, layers of material such as silicon oxide, silicon nitride, silicon oxynitride, polysilicon, aluminum, tungsten, titanium titanium nitride, copper, and multiple layers of such materials, as well as structures such as vias, trenches, and devices such as transistors, capacitors, resistors, and lines, etch. The sample substrate itself may be silicon. The sample may also comprise a reticle with the base or substrate of the reticle comprising glass.

The Die

The die may comprise a rectangular substrate such as, for example (when the substrate comprises silicon) the rectangular-shaped dies of silicon formed by dicing a silicon wafer. The die may also comprise a glass base such as a glass reticle. The dimensions of the die are selected to exceed the field of view of the test equipment so that any gap between the die and the wafer in which the die will be mounted will not be seen by the test equipment.

The Opening in the Die With Tapered Sidewalls

The opening in the die is formed preferably using an anisotropic wet etchant which is capable of forming an opening in the die with tapered sidewalls. For example, when the die comprises silicon, the wet etchant may comprise a hydroxyl-containing (—OH) etchant such as, by way of example, tetramethyl ammonium hydroxide (TMAH), potassium hydroxide (KOH), or ethylene diamine pyrocatechol ($C_6H_4(OH)_2$=EDT). However, as will be described below in connection with the embodiment of FIGS. 5B and 8B, a straight-walled opening may be formed in the die using a laser to cut the hole or opening in the die.

The Mounting of the Sample in the Die

Preferably the sample will be secured in the opening in the die by an adhesive. The adhesive may comprise any adhesive or "glue" capable of bonding to both the die and the sample. Examples of such adhesives include epoxies, carbon paste, a conductive gold adhesive, silver paste, or cyano acrylate. However, other securement means could be used to mount the sample in the opening in the die. Such other securement could include, for example, silicon fusion bonding, anodic bonding, and gold eutectic bonding.

An adhesive, however, is the presently preferred means for mounting the sample in the opening in the die. After applying the adhesive to the rear side of the sample and the tapered sidewalls of the die, the resulting structure is first allowed to air dry after which it is baked to remove any solvents to avoid any damage to the equipment being tested. Times for air drying and baking, as well as baking temperatures, may be empirically determined based on the particular materials utilized.

The Substrate

The substrate may comprise a silicon wafer such as utilized in the manufacture of integrated circuit chips or dies. The substrate may also comprise a glass base such as a glass reticle, particularly when the die substrate also comprises glass.

Description of the Illustrated Embodiments

Figure 3:
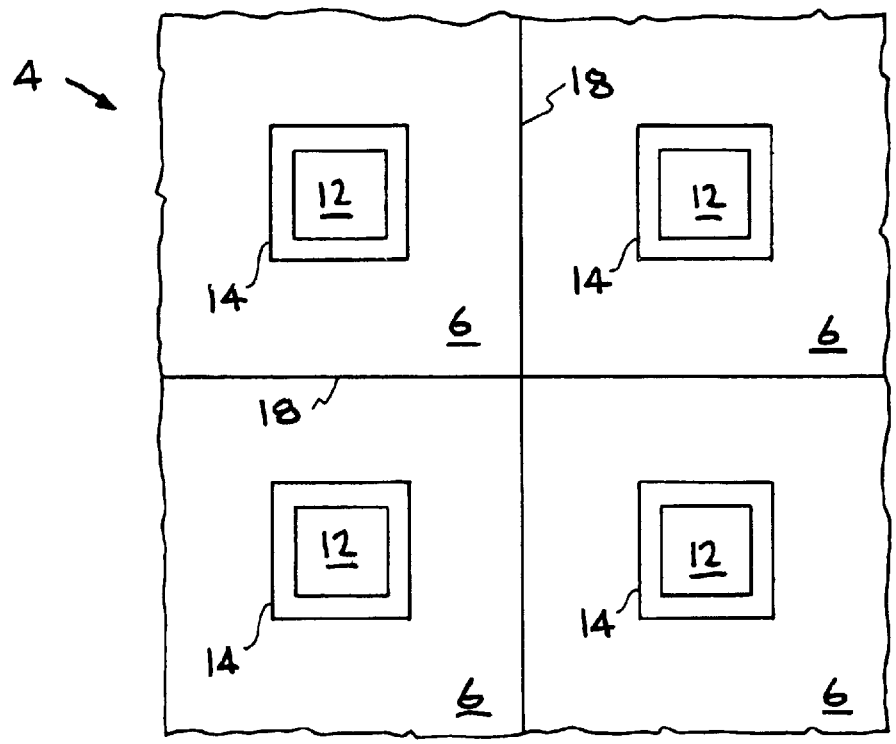
FIG. 3 is a fragmentary top view of a semiconductor wafer showing scribe lines already formed on the top surface in preparation for dicing the wafer into individual dies, with generally central openings shown formed completely through one or more of the dies in preparation for mounting the test samples therein.
Figure 4:
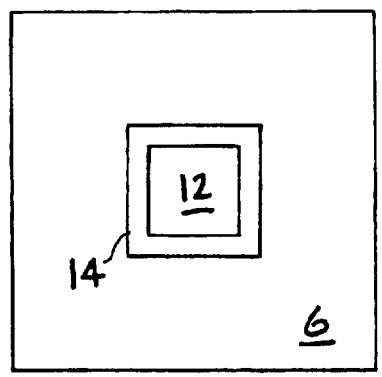
FIG. 4 is a top view of one of the dies formed from the scored wafer of FIG. 3, shown after dicing of the wafer.

Turning now to FIGS. 3–8, the invention will be further described. FIG. 3 shows that a source of the die in which the sample is mounted may comprise a silicon wafer prior to severance of wafer along score lines 18 into individual dies 6, one of which is shown in FIG. 4. As shown in both FIGS. 3 and 4, each die 6 is shown formed with a central rectangular opening 12 and tapered sidewalls 14. Opening 12 is sized to approximate, at the small end of tapered walls 14, the same dimensions as sample 16. As will be discussed below, dies 6 may be made other ways in other embodiments of the invention.

Figure 5:
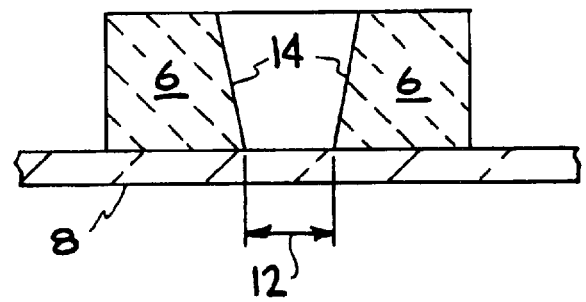
FIG. 5 is a fragmentary vertical side section view of the die structure shown in FIG. 4 with the lower surface of the die resting on a flat surface, and prior to insertion of the test sample into the central opening etched through the die.
Figure 6:
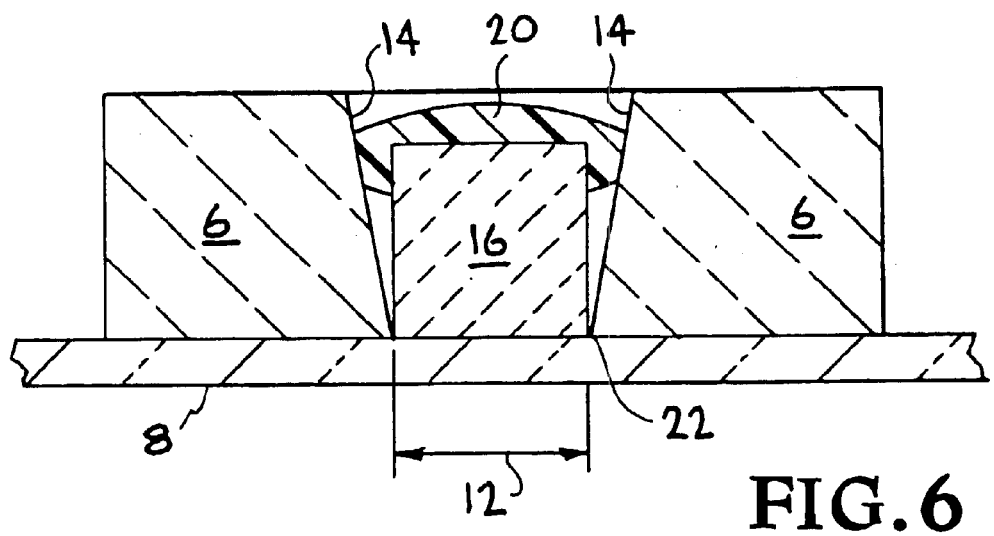
FIG. 6 is a fragmentary vertical side section view of the structure of FIG. 5, but with the test sample inserted in the central opening formed through the die, with both the bottom of the test sample and the lower surface of the die resting on a common flat surface, and with the test sample shown as mounted and secured in the central opening through the die using glue.

The individual die 6 is then releasably mounted on a flat surface 8, such as a glass plate, as shown in FIG. 5, with the surface of die 6 having the smallest dimension of opening 12 facing downward against flat surface 8. As seen in FIG. 6, sample 16 is then placed in the center of opening 12, with the surface to be examined, e.g., the surface containing the new technology, facing downward against flat surface 8.

It should be noted here that the thickness of die 6 exceeds the thickness of sample 16 to define a space on the backside of sample 16 which, in addition to the space between the tapered sidewalls 14 of die 6 and the straight walls of sample 16, provides a region for the admission of an adhesive 20 to secure sample 16 within opening 12 in die 6, as also seen in FIG. 6.

Figure 7:
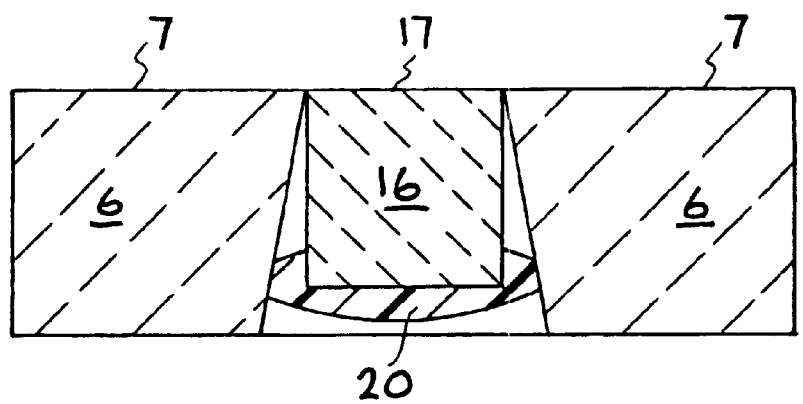
FIG. 7 comprises the structure of FIG. 6 after inversion of the die so that the respective flat surfaces of the test sample and the wafer formerly resting on the flat support surface during the gluing step now face upwardly.

After drying and curing of adhesive 20, die 6, along with sample 16 attached thereto in opening 12 in die 6, is inverted and flat surface 8 is removed (either by lifting die 6 off of flat surface 8 or inverting flat surface 8 with die 6 and then removing flat surface 8). The result is shown in FIG. 7. It will be noted that because of the sizing of the smallest portion of opening 12 to approximate the dimensions of sample 16, sample 16 directly abuts opening 12 at 22 in die 6, with virtually no gap between them. The inverted assembly of die 6 and sample 16 is then placed in an opening or pocket 32 in a wafer 2. Using prior art techniques, the surface 37 of wafer 2 will be coplanar with the top surface 7 of die 6 (as well as top surface 17 of sample 16) when the assembly of die 6 and sample 16 is placed in opening or pocket 32 of wafer 2. Such prior art techniques comprise the use of an adhesive at the bottom of pocket 32 to secure in place die 6. The adhesive also provides an adjustable spacer to make the top surface 7 of die 6 coplanar with wafer 2.

Figure 8A:
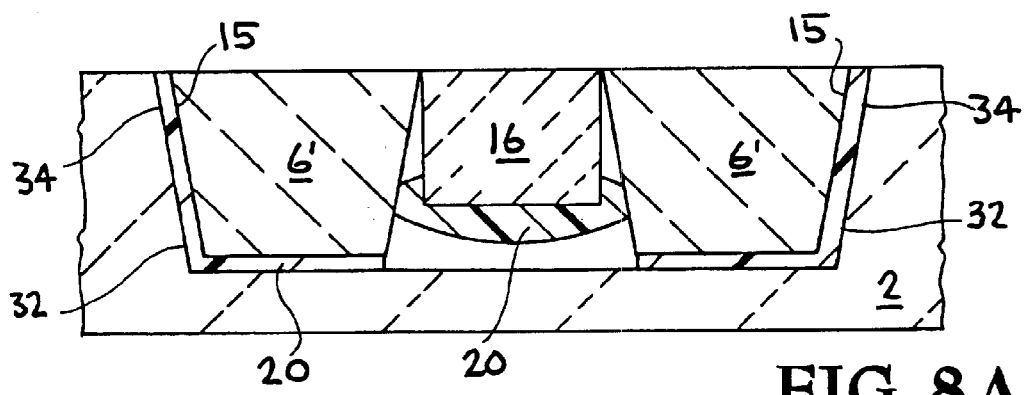
FIG. 8A is a fragmentary vertical side section view of the embodiment of the invention shown in FIG. 5A.
Figure 8B:
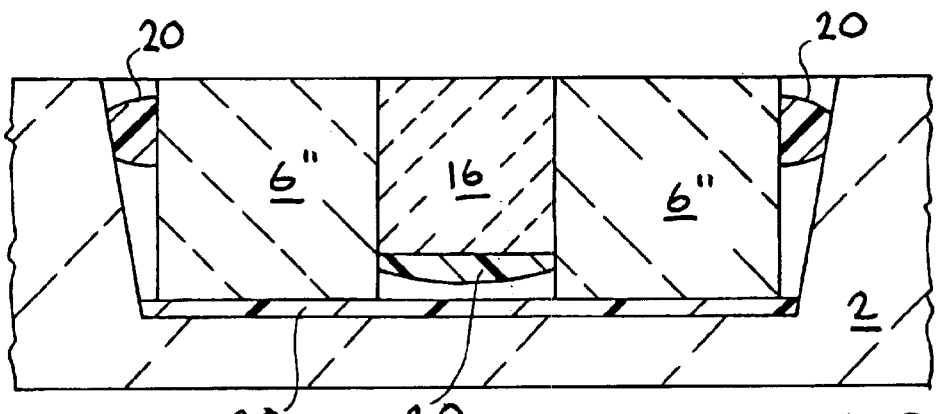
FIG. 8B is a fragmentary vertical side section view of the embodiment of the invention shown in FIG. 5B.
Figure 8:
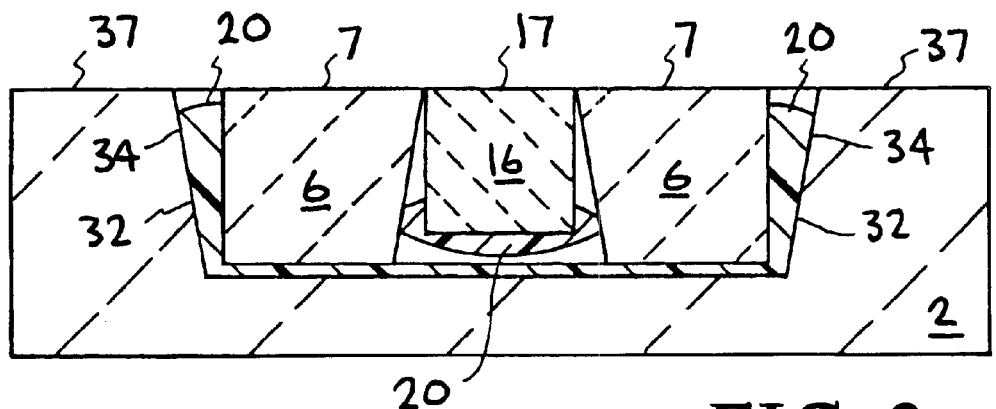
FIG. 8 is a fragmentary vertical side section view of the die of FIG. 7 shown mounted and secured by glue in an opening formed in a test wafer.

The resulting structure shown in FIG. 8 may now be used as a test wafer, with the gap formerly directly surrounding the sample now virtually eliminated, with the larger gap surrounding the die being too large in circumference to be seen by the equipment examining the surface of the sample, i.e., out of the field of sight of the test equipment.

Figure 5A:
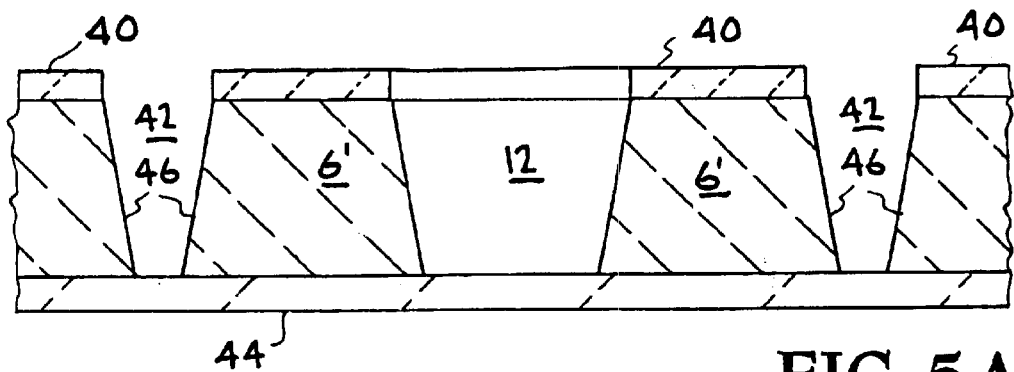
FIG. 5A is a fragmentary vertical side-section view of another embodiment which may be used to separate the wafer into a plurality of dies by etching of the wafer.

Turning now to FIGS. 5A and 8A, another embodiment is shown wherein a die 6' is formed from a silicon wafer by etching of the wafer rather than scribing the wafer with score lines. Instead a hard mask 40, formed, for example, of silicon oxide or silicon nitride, is used to define both opening 12 in die 6' into which sample 16 will be subsequently mounted, as shown in FIG. 5A and the opening 42 formed between die 6' and adjacent dies 46. A layer 44, preferably of the same material as hard mask 40 is applied to the back surface of the wafer from which the dies 6' are being formed.

After central opening 12 is etched through the silicon wafer, as well as through the openings or trenches 46 which will separate each die, the etchant is changed to an etchant which will remove hard mask 40 as well as layer 44 on the opposite surface of the wafer. Die 6' is then turned over and set on a flat surface, as in the previous embodiment, and sample 16 is inserted into opening 12 and onto the flat surface, After mounting of sample 16 into opening 12 of die 6', and securing of sample 16 therein, the assembly is again inverted and placed in a pocket or opening 32 previously formed in silicon wafer 30 and then bonded to silicon wafer 30. The result is shown in FIG. 8A. The advantages of this embodiment are that the previous etching step to form central opening 12 in die 6, and the dicing step are consolidated into a single step, and the gap between the die and the sidewall of the wafer can be minimized, particularly when the tapered sidewall 34 of pocket 32 is generally parallel to the tapered sidewall 15 of sample 16.

Figure 5B:
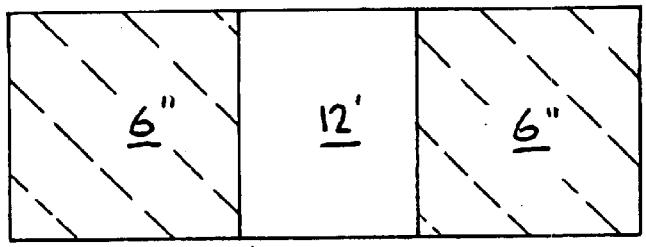
FIG. 5B is a fragmentary vertical side-section view of yet another embodiment of the invention.

FIGS. 5B and 8B illustrate yet another embodiment wherein opening 12' in die 6" is formed with a laser and therefore has straight walls formed perpendicular to the surface of die 6", thereby enabling a tight fit to be made between sample 16 and opening 12', thus narrowing the gap further, The remainder of the processing is then carried out as previously described, with the final result shown in FIG. 8B. It will be noted that the adhesive forms a bond between the rear surface of sample 16 and the non-tapered sidewall of opening 12' in die 6". It should be also noted that the use of a laser in the prior art process was precluded by the requirement that the bottom profile of test wafer 2 be flat to resemble the backside of a conventional wafer, and the laser would have cut completely through test wafer 2. However, by using die 6 between sample 16 and test wafer 2 (instead of the prior art practice of mounting the sample directly into a pocket in the test wafer), a laser could be used to form an opening in the die with straight sidewalls.

Thus, suppression of formation of a visible gap adjacent the edges of a small sample mounted in an opening in a large substrate may be achieved by mounting the small sample in an opening in an intermediate size die, and then mounting the die and sample assembly in an opening in the large substrate.

Having thus described the invention what is claimed is:

1. A process for mounting, in a large substrate, a small sample having formed in one surface thereof integrated circuit structure, said small sample mounted in said large substrate in a manner which permits access to said integrated circuit structure on said surface of said small sample, while suppressing formation of a visible gap around the edge of the sample comprises:
   a) first mounting said small sample in a tapered opening formed completely through an intermediate die with said surface of said sample having said integrated circuit structure therein mounted adjacent the small portion of said tapered opening directly abutting one or more edges of said small portion of said tapered opening in said die; and
   b) then mounting said intermediate die in an opening in said large substrate in a manner wherein said surface of said small sample having said integrated circuit structure faces away from said opening in said large substrate to permit access to said integrated circuit structure by test equipment;
wherein said tapered opening in said die is sized to equal at least one dimension of said small sample to thereby suppress formation of a visible gap between said small portion of said tapered opening and said one or more edges of said small sample.

2. The process of claim 1 wherein said small sample is rectangular.

3. The process of claim 2 wherein said opening in said die is tapered and is rectangular in cross section to facilitate mounting said rectangular small sample in said tapered opening in said die and suppress formation of said visible gap between said die and said sample.

4. The process of claim 3 wherein said opening in said die is sized to equal, at the smallest end of said tapered sidewalls of said opening, at least one dimension of said small sample to thereby suppress formation of a visible gap adjacent said one or more edges of said small sample abutting said opening in said die.

5. The process of claim 2 wherein said opening in said die is formed with straight sidewalls.

6. The process of claim 5 wherein said opening in said die with said straight sidewalls is cut through said die with a laser.

7. The process of claim 5 wherein said die comprises a silicon die cut from a silicon wafer.

8. The process of claim 5 wherein said die comprises a silicon die etched from a silicon wafer and said outer walls of said silicon die are tapered.

9. The process of claim 8 wherein said opening in said substrate has tapered sidewalls which are parallel to said tapered outer sidewalls of said die when said die is mounted in said opening in said substrate.

10. A structure for mounting, in a large substrate, a small sample having formed in one surface thereof integrated circuit structure, said small sample mounted in said large substrate in a manner which permits access to said integrated circuit structure while suppressing formation of a visible gap around the edge of the sample comprises:
   a) said small sample mounted in a tapered opening formed completely through an intermediate die, said tapered opening terminating, at its small end, in a first surface of said intermediate die, with said first surface of said small sample having said integrated circuit structure therein mounted adjacent to and directly abutting the small portion of said tapered opening in said die to form a coplanar surface between said first surface of said small sample and said first surface of said intermediate die, while suppressing formation of a visible gap around the edge of said small sample; and
   b) a large substrate having an opening in which is mounted, said intermediate die in a manner which causes said first surface of said small sample, containing said integrated circuit structure therein, to face away from said large substrate to thereby permit visual access to said integrated circuit structure.

11. The structure of claim 10 wherein said small sample is rectangular.

12. The structure of claim 11 wherein said opening in said die is sized, in cross section, to equal, at the smallest end of said tapered sidewalls of said opening, the cross sectional area of said first surface of said small sample to thereby suppress formation of a visible gap adjacent said first surface of said small sample abutting said opening in said die.

13. The structure of claim 11 wherein said opening in said die has straight sidewalls.

14. The structure of claim 13 wherein the outer walls of said die are tapered.

15. The structure of claim 14 wherein said opening in said substrate has tapered sidewalls which are parallel to said tapered outer sidewalls of said die when said die is mounted in said opening in said substrate.

16. A process for mounting a small sample in a large substrate with a first surface of said small sample coplanar with a first surface of said large substrate, while suppressing formation of a visible gap around the edge of the sample comprises:
   a) first mounting said small sample in a tapered opening formed completely through an intermediate die, with one or more edges of said first surface of said sample directly abutting one or more edges of a first surface of said intermediate die at a small end of said tapered opening in said die to thereby form a coplanar surface comprising said first surface of said small sample and said first surface of said intermediate die and to suppress formation of a visible gap between said one or more edges at said small end of said tapered opening in said intermediate die; and
   b) then mounting said intermediate die, with said small sample mounted thereto, in an opening in said first surface of said large substrate with said first surface of said small sample facing away from said large substrate; and coplanar with said first surface of said large substrate;
whereby said first surface of said small sample is visible to permit access to.

17. A process for mounting a small sample, having a rectangular first surface thereon, in the small end of a tapered opening formed completely through an intermediate die, wherein said small end of said tapered opening has a cross sectional area approximately the same as said rectangular first surface of said small sample, and mounting said intermediate die in an opening in a large substrate with said rectangular first surface of said small sample coplanar with a first surface of said intermediate die, to thereby suppress formation of a visible gap around the edges of said first surface of said small sample, said process comprising:
   a) first mounting said small sample in said tapered opening formed completely through said intermediate die with one or more edges of said first surface of said sample directly abutting one or more edges at said first surface of said intermediate die at a small end of said tapered opening in said die to thereby form a coplanar surface comprising said first surface of said small sample and said first surface of said intermediate die, and to suppress formation of a visible gap between said one or more edges of said first surface of said small sample and one or more edges at said small end of said tapered opening; and b) then mounting said intermediate die, with said small sample mounted thereto, in an opening in a first surface of said large substrate with said first surface of said small sample facing away from said large substrate and coplanar with said first surface of said large substrate;

whereby said first surface of said small sample is visible to permit access thereto.

18. A process for mounting, in a test substrate, a rectangular test sample having an exposed first surface thereon with integrated circuit structure formed in said exposed first surface of said test sample, to permit examination of said integrated circuit structure and/or testing and calibrating equipment for use with said integrated circuit structure, without the formation of gaps around the edge of the sample visible to equipment being tested and calibrated comprising:

a) forming one or more tapered openings extending completely through a planar die from a first surface thereon to an opposite surface with the narrow portion of said one or more tapered openings terminating at said first surface of said planar die, said tapered opening defining, at said first surface of said planar die; a rectangle of approximately the same size as said rectangular test sample;

b) removably placing said first surface of said planar die on a flat surface, wherein portions of said flat surface are visibly at the bottom of said one or more tapered openings in said die;

c) inserting, into at least one of said one or more tapered openings extending completely through said planar die, a test sample having a thickness equal to or less than the thickness of said planar die, and having integrated circuit structure formed in an exposed first surface thereof, said exposed first surface of said test sample having a cross sectional profile conforming to the cross sectional profile of said tapered opening at said first surface of said planar die, said first surface of said test sample inserted into said tapered opening contacting said flat surface whereby said first surface of said planar die and said first surface of said test sample are coplanar on said flat surface;

d) contacting, with an adhesive, an opposite surface of said test sample, said tapered sidewalls of said planar die, and exposed portions of sidewalls of said test sample to secure said test sample die;

e) removing said flat surface from said planar die and said test sample, leaving a coplanar surface formed by said first surface of said planar die and said first surface of said test sample; with the edges of said first surface of said sample directly abutting the edges of said smallest portion of said tapered opening in said first surface of said planar die; and f) securing said bonded-together test sample and planar die into an opening in a rigid substrate with said coplanar surface facing outward to permit external access to said integrated circuit structure formed in said first surface of said test sample, said opening in said substate having a depth approximately equal to the thickness of said planar die.

* * * * *